(12) United States Patent
Wang et al.

(10) Patent No.: US 9,099,227 B2
(45) Date of Patent: Aug. 4, 2015

(54) METHOD OF FORMING CONDUCTIVE FILMS WITH MICRO-WIRES

(71) Applicants: Yongcai Wang, Rochester, NY (US); John Andrew Lebens, Rush, NY (US); Mitchell Lawrence Wright, Rochester, NY (US)

(72) Inventors: Yongcai Wang, Rochester, NY (US); John Andrew Lebens, Rush, NY (US); Mitchell Lawrence Wright, Rochester, NY (US)

(73) Assignee: EASTMAN KODAK COMPANY, Rochester, NY (US)

( * ) Notice: Subject to any disclaimer, the term of this patent is extended or adjusted under 35 U.S.C. 154(b) by 114 days.

(21) Appl. No.: 14/017,638

(22) Filed: Sep. 4, 2013

(65) Prior Publication Data

US 2015/0064426 A1     Mar. 5, 2015

(51) Int. Cl.
| | | |
|---|---|---|
| *H01B 13/00* | (2006.01) | |
| *H01B 1/02* | (2006.01) | |
| *H01B 13/30* | (2006.01) | |
| *G03F 7/00* | (2006.01) | |

(52) U.S. Cl.
CPC .......... *H01B 13/0013* (2013.01); *G03F 7/0002* (2013.01); *H01B 1/02* (2013.01); *H01B 13/003* (2013.01); *H01B 13/0036* (2013.01); *H01B 13/30* (2013.01)

(58) Field of Classification Search
CPC .. H01B 1/02; H01B 13/0036; H01B 13/0013; H01B 13/003; H01B 13/30; G03F 7/0002
USPC ............... 430/315, 319, 321; 427/126.5, 108, 427/553, 555, 558, 164; 428/209; 174/253
See application file for complete search history.

(56) References Cited

U.S. PATENT DOCUMENTS

| | | | |
|---|---|---|---|
| 7,922,939 B2 | 4/2011 | Lewis et al. | |
| 7,931,941 B1 | 4/2011 | Mastropietro et al. | |
| 8,179,381 B2 | 5/2012 | Frey et al. | |
| 8,227,022 B2 | 7/2012 | Magdassi et al. | |
| 2010/0224026 A1 | 9/2010 | Brennan Fournet et al. | |
| 2010/0328248 A1 | 12/2010 | Mozdzyn | |
| 2011/0254191 A1 | 10/2011 | Takeuchi | |
| 2012/0168684 A1 | 7/2012 | Magdassi et al. | |
| 2012/0287507 A1 | 11/2012 | Lee et al. | |
| 2014/0106134 A1* | 4/2014 | Fu et al. ..................... | 428/195.1 |
| 2014/0284082 A1* | 9/2014 | Zhou ............................. | 174/251 |

FOREIGN PATENT DOCUMENTS

| | | |
|---|---|---|
| CN | 102063951 | 5/2010 |
| WO | WO 2010/109465 | 9/2010 |

\* cited by examiner

*Primary Examiner* — John A McPherson
(74) *Attorney, Agent, or Firm* — J. Lanny Tucker

(57) ABSTRACT

A pattern of conductive micro-wires as in a conductive pattern can be prepared using photo-lithography, or imprint technology. A photocurable composition is cured to form a pattern of photocured micro-channels. A conductive composition comprising metal nano-particles is added to the photocured micro-channels and excess conductive composition outside the photocured micro-channels is removed. The conductive composition in the photocured micro-channels is then dried at a temperature of less than 60° C. The dried conductive composition in the photocured micro-channels is treated with hydrogen chloride vapor to form conductive micro-wires in the photocured micro-channels at a temperature of less than 60° C. The outer surface of the conductive micro-wires is then polished in the presence of water, to form a micro-wire pattern.

14 Claims, 12 Drawing Sheets

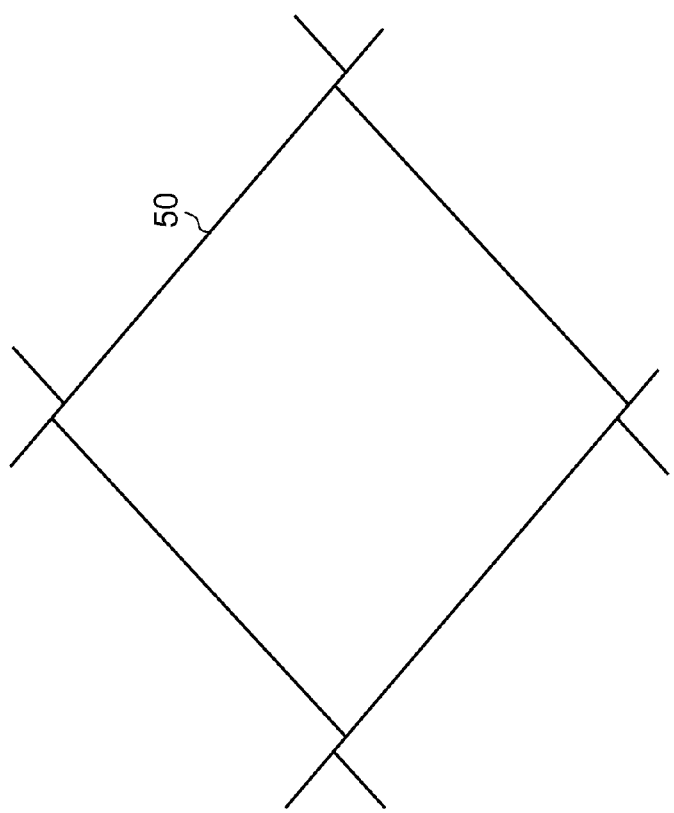

METHOD OF FORMING CONDUCTIVE FILMS WITH MICRO-WIRES

CROSS REFERENCE TO RELATED APPLICATIONS

Reference is made to commonly assigned, co-pending U.S. patent application Ser. No. 14/017,707 filed Sep. 4, 2013, by Wang, Lebens, and Dicillo and entitled "PHOTOCURABLE COMPOSITION, ARTICLE, AND METHOD OF USE," the disclosure of which is incorporated herein by reference.

Reference is also made to the following commonly assigned and copending patent applications:

U.S. Ser. No. 13/746,346 filed Jan. 22, 2013 by Lebens et al.;
U.S. Ser. No. 13/746,352 filed Jan. 22, 2013 by Lebens et al.;
U.S. Ser. No. 13/757,891 filed Feb. 4, 2013 by Wang et al.;
U.S. Ser. No. 13/757,896 filed Feb. 4, 2013 by Wang et al.;
U.S. Ser. No. 13/757,899 filed Feb. 4, 2013 by Wang et al.;
U.S. Ser. No. 13/757,901 filed Feb. 4, 2013 by Wang et al.;
U.S. Ser. No. 13/757,905 filed Feb. 4, 2013 by Wang et al.;
and
U.S. Ser. No. 13/757,913 filed Feb. 4, 2013 by Wang et al.;
the disclosures of all of which are incorporated herein by reference.

FIELD OF THE INVENTION

This invention relates to a method for forming a micro-wire pattern on a substrate in conductive articles. More specifically, this invention relates to a method for forming conductive articles (films) that comprise fine line patterns of conductive micro-wires provided using photo-imprint lithography.

BACKGROUND OF THE INVENTION

Photo-imprinting techniques have been proposed as methods for forming micrometer and sub-micrometer size features on a substrate. In such techniques, patterns are formed by pressing an imprinting stamp or mold that has a preformed pattern on its surface, against a substrate having a layer (receiving layer) that can be imprinted. Both thermoplastic resins and photocurable resins can be used as the receiving layer. A thermoplastic resin can be heated above its softening point before imprinting and subsequently cooling to lower temperatures that cause the pattern to be fixed on the receiver layer surface before the imprinting stamp or mold is released. With photocurable resins, the imprinting stamp or mold is pressed against the receiver layer surface during irradiation (photo-imprint lithography). The resulting pattern can be fixed by photocuring. Depending on the nature of the photocurable resin, an additional thermal curing can be used before the imprinting stamp or mold is released. Such imprinting techniques are also known in the art as embossing or impressing.

A variety of known materials are useful for photo-imprint lithography. For example, photocurable compositions comprising a highly branched, multifunctional epoxy bisphenol A-novolac resins, such as Epon SU-8 from Momentive Specialty Chemicals Inc. have been described in the literature as high-aspect resists for thick-film applications. The photocurable compositions are generally formulated as solutions including an acid generating compound such as a di- or tri-aryl-substituted sulfonium or iodonium complex salt. The photocurable compositions can be applied to a substrate and dried to provide a dry coating thickness up to 100 µm. The dried coating can be photoimaged by exposure to UV light through a patterned photomask using contact, proximity, or projection exposures and then developed to form a high-resolution, negative-tone relief image of the photomask. Other performance benefits with the use of Epon SU-8 are its excellent thermal, chemical, and etching resistances when it is cured properly.

Recently, transparent electrodes including very fine patterns of conductive micro-wires have been proposed for various uses including touch screen displays. For example, capacitive touch screen displays having mesh electrodes including very fine line patterns of conductive elements, such as metal wires or conductive traces, are taught in U.S. Patent Application Publication 2010/0328248 (Mozdzyn) and U.S. Pat. No. 8,179,381 (Frey et al.), the disclosures of which are incorporated herein by reference. As disclosed in U.S. Pat. No. 8,179,381, fine conductor patterns are made by one of several processes, including laser-cured masking, inkjet printing, gravure printing, micro-replication, and micro-contact printing. The transparent micro-wire electrodes can include micro-wires that are 0.5 µm and 4 µm wide and exhibit a transparency in the display of 86% to 96%.

Fine patterns of conductive micro-wires can also be formed by inkjet printing conductive compositions ("inks") onto a substrate followed by sintering the conductive compositions at a proper temperature, for example as described in U.S. Pat. No. 8,227,022 (Magdassi et al.) wherein it is disclosed to generate conductive patterns using aqueous-based silver nano-particle inks with multi-pass inkjet printing (5 passes or more) and sintering the printed patterns at temperatures of equal to greater than 150° C.

Moreover, U.S. Pat. No. 7,922,939 (Lewis et al.) discloses a silver nano-particle containing conductive composition having a silver concentration greater than 50% by weight. These conductive compositions can be considered as a high-viscous gel and have an elastic modulus value greater than the loss modulus value. However, the electrical conductivity generated by such conductive compositions is limited after annealing at high temperatures.

U.S. Pat. No. 7,931,941 (Mastropietro et al.) discloses a method of making a silver nano-particle dispersion using a carboxylic acid stabilizer sintering resulting conductive films at lower sintering temperatures. However, such dispersions cannot be readily formulated into conductive compositions.

WO2010/109465 (Magdassi et al.) discloses incorporating halide ions as a sintering agent into silver-containing dispersions or imprintable receivers to improve conductivity of the resulting patterns.

The art describes various forms of non-aqueous based silver nano-particle dispersions and some are commercially available. For environmental and safety reasons, it is highly desirable to have aqueous-based silver nano-particle dispersions. For performance reasons, it is highly desirable that these aqueous silver nano-particle dispersions are colloidally stable, can be prepared at high concentrations with low viscosities, are water reducible with excellent re-dissolution behaviors, and have excellent electrical conductivity after sintering.

Conductive micro-wires can be formed in micro-channels that have been embossed or imprinted into a photocurable composition on a substrate as described above. A photocurable composition can be applied to a suitable substrate A pattern of micro-channels is embossed (impressed) onto the photocurable composition layer by a master (or mold) having a reverse pattern of ridges formed on its surface. The impressed photocurable composition is then cured by light before the master (mold) is released. An additional heat curing step can be used to further cure the composition. A conductive composition can be coated over the substrate, flowing into the formed micro-channels, and it is desired to remove excess conductive composition between micro-channels for example by mechanical buffing, patterned chemical electrolysis, or patterned chemical corrosion. The conductive composition remaining in the micro-channels can be cured, for example by heating.

The challenge for using such a method is to completely fill the micro-channels with the conductive composition without retaining residual conductive composition between the micro-channels. Yet, if the micro-channels are not completely filled with conductive composition, the conductivity of the micro-wires is significantly reduced and if the residual conductive composition is not removed, transparency of substrate and resulting conductive articles are impaired.

Besides the high transparency and conductivity that are desired, it is also desirable that the conductive micro-wires have good adhesion to the micro-channels on the substrate and are protected from scratches and other potential physical damage. Good micro-wire adhesion is required for flexible displays that can potentially experience a great deal of bending or flexing during device manufacture. Conversely, weak micro-wire adhesion can lead to the micro-wires popping out of the micro-channels and breaking.

All of these needs for the noted conductive devices containing conductive micro-wires on substrate, especially flexible substrates, require a careful design and balancing of competing properties in the conductive composition and method of making the conductive patterns or grids. It has not been readily apparent how to achieve all of these properties to a satisfactory degree since efforts to improve one feature can diminish another feature.

There is a need, therefore, for a method of providing conductive micro-wires on a substrate with optimal conductivity and transparency without undesirable diminishing of various physical properties.

SUMMARY OF THE INVENTION

To address the problems noted above, the present invention provides a method of making a micro-wire pattern in an article, the method comprising:

providing a photocurable article comprising a photocurable composition on a transparent substrate, forming a pattern of micro-channels within the photocurable composition, exposing the photocurable composition to curing radiation to form cured photocurable composition and photocured micro-channels within the cured photocurable composition on the transparent substrate, applying a conductive composition comprising metal nano-particles to the photocured micro-channels, removing any excess conductive composition outside the photocured micro-channels while leaving conductive composition within the photocured micro-channels, drying the conductive composition in the photocured micro-channels at a temperature of less than 60° C. to provide a dried conductive composition as conductive micro-wires in the photocured micro-channels, exposing the dried conductive composition in the photocured micro-channels to hydrogen chloride at a temperature of less than 60° C. to enhance the conductivity of the conductive micro-wires in the photocured micro-channels, and polishing the outer surface of the cured photocurable composition in the presence of water, to form a micro-wire pattern on the transparent substrate.

The present invention also provides an article comprising a transparent substrate and a micro-wire pattern prepared according to the method of any embodiment of the present invention.

Thus, the present invention provides a conductive electrode comprising very fine patterns of conductive micro-wires entrenched in micro-channels on a transparent support, wherein the micro-channels comprise a photocured product of a photocurable composition and the conductive micro-wires are a hydrogen chloride vapor treated product of the conductive metal nano-particles.

In particularly useful embodiments, the conductive electrodes or other conductive articles are highly transparent (for example, at least 80%) to actinic (room light) and comprise very fine patterns of conductive micro-wires entrenched in micro-channels on a transparent substrate.

A significant advantage of the present invention is that the transparent conductive electrode formed thereby has very low distortion and desired uniformity (especially when the transparent substrate comprises a flexible material), excellent optical properties (low surface haze of less than 2%, and at least 80% light transmission), and exceptional low electrical resistivity of less than 10 ohms/sq with the conductive micro-wires having an average width of less than 3 μm. The transparent conductive electrode of the present invention can be used to form large touch screen (or panel) displays especially those having flexible transparent polymeric substrates that exhibit an improved high-frequency response.

The present invention enables the use of conductive compositions distributed within the cured micro-channels having higher amounts of silver. When cured, the conductive compositions exhibit improved conductivity and transparency compared to prior art conductive pastes in which the conductive particles are not properly distributed whereby fine conductive lines and intersections are less likely. Accordingly, the present invention can provide improved micro-wire conductivity and substrate transparency over prior-art devices.

Thus, it has been demonstrated that the specific sequential features of the method of the present invention, and particularly treating the conductive micro-wires (conductive composition in the photocured micro-channels) with hydrogen chloride, and then polishing the outer surface of the conductive micro-wires in the photocured micro-channels in the presence of water, in that order, effectively results in the formation of micro-wires with enhanced conductivity and the transparency of the resulting conductive article.

The prior art does not suggest the noted order of method features. If, for example, the hydrogen chloride treatment is carried out after the surface polishing, the micro-wire electrical conductivity is hardly improved. Similarly, if polishing is carried out after the hydrogen chloride treatment but without the presence of water, the removal of residual conductive composition is less effective and the surface is easily scratched, reducing the transparency of the resulting article.

BRIEF DESCRIPTION OF THE DRAWINGS

Representative features and advantages of the present invention will become more apparent when taken in conjunction with the following description and drawings wherein identical reference numerals have been used to designate identical features that are common to the FIGS. and wherein:

FIG. 3 is a diagram of a single diamond pattern formed on a mold surface that can be used to form an imprint in a coating of a photocurable composition in accordance with the present invention.

DETAILED DESCRIPTION OF THE INVENTION

Definitions

Figure 1:
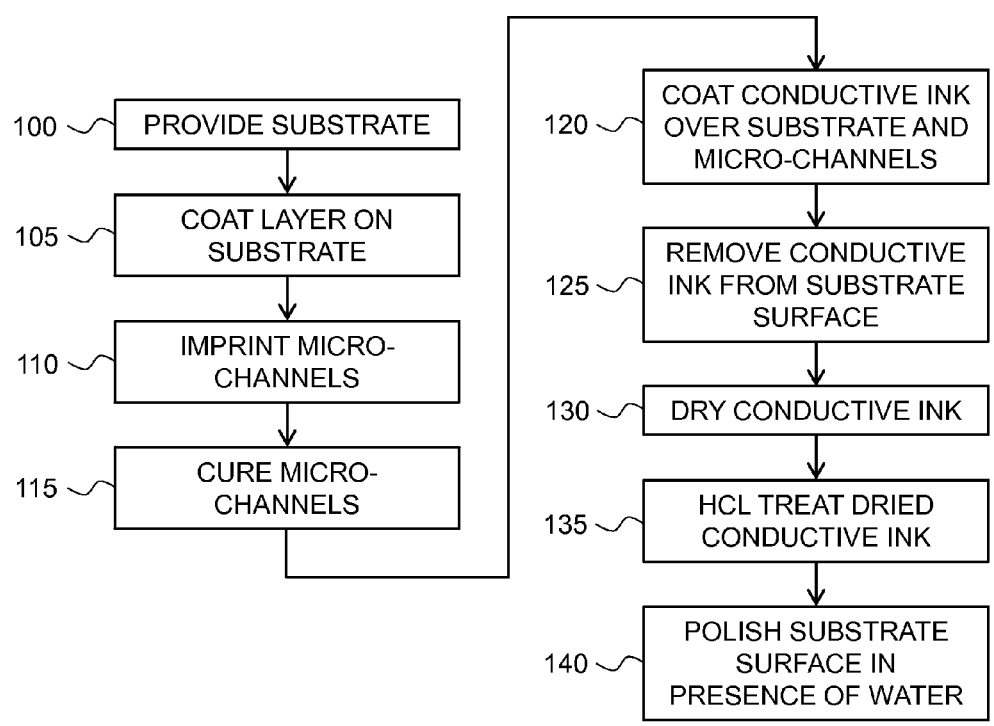
FIG. 1 is a flow diagram representing at least one embodiment of the method of the present invention.

As used herein to define various components of the photocurable composition, conductive compositions, conductive layers, and formulations, unless otherwise indicated, the singular forms "a," "an," and "the," are intended to include one or more of the components (that is, including plurality referents).

Each term that is not explicitly defined in the present application is to be understood to have a meaning that is commonly accepted by those skilled in the art. If the construction of a term would render it meaningless or essentially meaningless in its context, the term's definition should be taken from a standard dictionary.

The use of numerical values in the various ranges specified herein, unless otherwise expressly indicated otherwise, are considered to be approximations as though the minimum and maximum values within the stated ranges were both preceded by the word "about." In this manner, slight variations above and below the stated ranges can be used to achieve substantially the same results as the values within the ranges. In addition, the disclosure of these ranges is intended as a continuous range including every value between the minimum and maximum values.

The term "imprinting" used herein to form the micro-channels in a photocurable composition of the present invention can also be known as "embossing" or "impressing."

A "micro-channel" is a groove, trench, or channel formed on or in a substrate as described below and generally includes an average depth and average width in micrometers.

"Wet" and "dry" hydrogen chloride vapor refer to hydrogen chloride vapor that is composed of pure hydrogen chloride gas, or a gas mixture containing a significant amount of hydrogen chloride, with or without the presence of moisture (water).

The articles of the present invention generally exhibit a transparency to visible radiation of at least 80% and particular of at least 85% using spectrophotometry and known procedures.

In general, the articles of this invention exhibit a haze value of less than 10% and more typically less than 2%, as determined by spectrophotometry and known procedures.

When used to define width of micro-wires prepared by the present invention, "average" can be determined by making at least 5 measurements of the micro-wires at 5 different places in the micro-wire pattern.

Transparent conductors and articles of the present invention have many uses. For example, they can be used for EMI shielding and in photovoltaic devices. They are also useful in display devices for electrical switch light-emitting or light-transmitting properties of a display pixel, for example in liquid crystal or organic light-emitting diode displays, or to form touch screens in various types of displays. In touch screen applications, the optical transparency is limited by the width of conductive traces (lines and intersections) used to form the conductive electrodes, their density and uniformity. It is highly desirable to limit the width of the conductive lines to an average width of less than 5 μm. Various printing and replication methods can potentially be used to form such thin conductive traces.

The present invention can be illustrated by reference to the FIGS. provided with this disclosure.

Figure 2A:
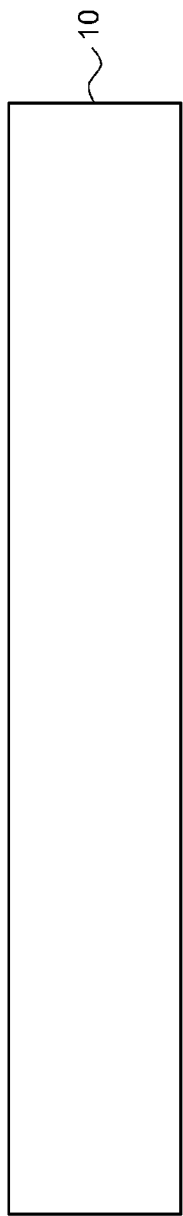
FIGS. 2A-2J are sequential cross-sectional views illustrating an embodiment of the method of the present invention.
Figure 2B:
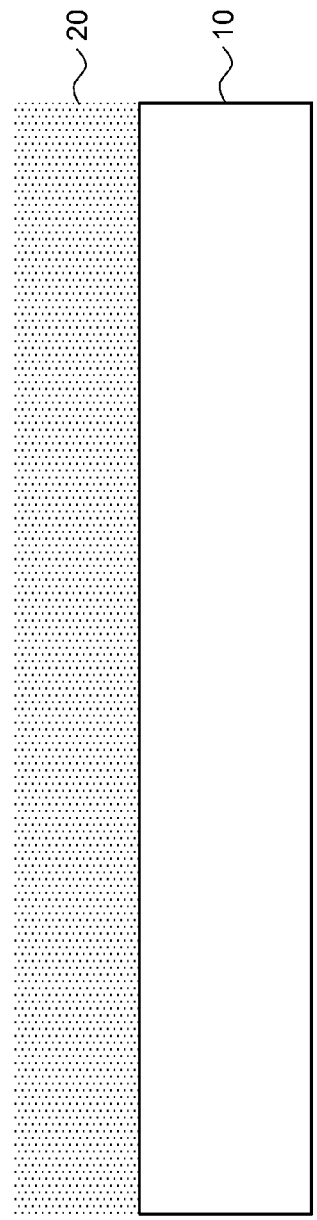

Referring to FIGS. 1 and 2A-2J, transparent substrate 10 is provided in step 100 (FIG. 2A). Photocurable layer 20 (or photoresist layer) is provided over transparent substrate 10 in step 105 (FIG. 2B). Transparent substrate 10 can be formed from any conventional material. It is particularly useful that transparent substrate 10 comprises a transparent material selected from but not limited to, polyesters such as poly(ethylene terephthalate) and poly(ethylene naphthalate), polycarbonates, polyamides, polyimides, glass, cellulose triacetate, polystyrene, and others that would be known in the art. Flexible transparent polymeric materials are particularly useful for preparing transparent substrate 10. Photocurable layer 20 has an average dry thickness of at least 0.1 μm and up to and including 100 μm. For example, photocurable layer 20 can have a softening point of at most 60° C. Depending on the use of article prepared by the invention, photocurable layer 20 can further be overlaid with a protective sheet for easier handling and manipulation and for easier and flexible manufacturing.

Photocurable layer 20 can be composed of any useful photocurable composition known in the art, and particularly the composition comprising a crosslinkable material. For example, the photocurable composition can be a UV curable acrylate composition comprising a multi-functional acrylate monomer and a photoinitiator that generates a free radical upon exposure to UV radiation. The photocurable composition can also be a photocurable epoxy composition that comprises a multi-functional epoxy compound and a photoinitiator that generates an acid upon exposure to radiation (for example, visible light). The following discussion relates to a particularly useful photocurable composition but it is to be understood that the present invention is not limited to using only this photocurable composition.

A particularly useful photocurable composition comprises a compound that generates an acid upon exposure to radiation of at least 190 nm and up to and including 500 nm, a multi-functional epoxy compound having an epoxy equivalent molecular weight of less than 1,000, and an epoxysilane oligomer that is represented by the following Structure (I):

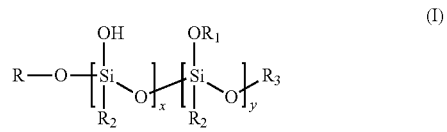

wherein R and $R_1$ are independently substituted or unsubstituted alkyl groups, $R_2$ is a substituted or unsubstituted linear, branched, or cyclic alkyl group or an alkyl ether residue substituted with an epoxide, $R_3$ is hydrogen or a substituted or unsubstituted alkyl, and x+y≥2.

Thus, one essential component of this photocurable composition is a compound (or mixture thereof) that provides or generates an acid having a pKa of less than 2 or typically a pKa less than 0 during exposure to radiation having a $\lambda_{max}$ of at least 190 nm and up to and including 500 nm, or typically radiation having a $\lambda_{max}$ of at least 250 nm and up to and including 450 nm to initiate reaction with epoxy groups.

Particularly useful acid-generating compounds are onium salts that decompose upon irradiation. An onium salt (also known as an onium compound) is a compound that is formed by the attachment of a proton to a mononuclear parent hydride of a Group 15 element (for example nitrogen and phosphorus), a chalcogen of Group 16 (for example sulfur and selenium), or a halogen (such as fluorine, chlorine, and iodine). Particularly useful onium salts include but are not limited to, sulfonium salts, phosphonium salts, iodonium salts, aryldiazonium salts, hydroxyimide sulfonates, hydroxyimino sulfonates, and nitrobenzyl sulfonate esters. The sulfonium salts, phosphonium salts, and iodonium salts are particularly useful, including but not limited to arylsulfonium salts and aryliodonium salts. Useful onium salts have substituted aryl groups and strong acid anions such as hexafluorophosphate, tetrafluoroborate, hexofluoroarsenate, and hexafluoroantimonate. Representative examples of useful onium salts are triphenyl sulfonium triflate, trifluoromethylsulfonic acid, and bis(4-t-butylphenyl) iodonium triflate. Other useful onium salts are described for example in U.S. Pat. No. 4,210,449 (Schlesinger et al.), U.S. Pat. No. 4,273,668 (Crivello), and U.S. Pat. No. 4,491,628 (Frechet et al.), the disclosures of which are incorporated herein by reference with respect to the onium salts.

More particularly, the acid generating compound is an onium salt of a Group V-A element, an onium salt of a Group VI-A element, or an aromatic halonium salt. Examples of triaryl-substituted sulfonium complex salts useful as acid-generating compounds include but are not limited to, triphenylsulfonium tetrafluoroborate, triphenylsulfonium hexafluorophosphate, triphenylsulfonium hexafluoroantimonate, tritolylsulfonium hexafluorophosphate, anisyldiphenylsulfonium hexafluoroantimonate, 4-butoxyphenyldiphenyl-sulfonium tetrafluoroborate, 4-chlorophenyldiphenylsulfonium hexafluoro-antimonate, 4-acetoxy-phenyldiphenylsulfonium tetrafluoroborate, 4-acetamidophenyldiphenylsulfonium tetrafluoroborate, 4-[4-(2-chlorobenzoyl)-phenylthio]phenylbis(4-fluorophenyl)sulfonium hexafluoroantimonate (Adeka Optmer SP-172 by Asahi Denka Kogyo KK).

Examples of aryl-substituted iodonium complex salt acid-generating compounds include but are not limited to, diphenyliodonium trifluoromethanesulfonate, (p-t-butoxyphenyl) phenyliodonium trifluoromethanesulfonate, diphenyliodoniump-toluenesulfonate, (p-t-butoxyphenyl)-phenyliodonium p-toluenesulfonate, bis(4-t-butylphenyl)iodonium hexafluorophosphate, and diphenyliodonium hexafluoroantimonate.

One or more compounds that generate the desired acid(s) are generally present in the photocurable composition (and dry photocurable layer) in an amount of at least 0.1 weight % and up to and including 20 weight %, or more likely at least 1 weight % and up to and including 10 weight %, based on the total photocurable composition solids (or dry photocurable layer weight).

A second essential component of the photocurable composition is a multifunctional epoxy compound (or mixture thereof). The multifunctional epoxy compounds generally have an epoxy equivalent molecular weight of less than 1000, and more likely less than 500. Thus, these compounds contain a sufficient number of epoxy groups in one molecule for efficient curing reactions with the acid-generating compounds described above. In addition, the multifunctional epoxy compound can have a molecular weight of at least 2,000 and up to and including 11,000, or more likely at least 2,000 and up to and including 8,000, as determined by size exclusion chromatography. Moreover, the multifunctional epoxy compound can have a softening point of 20° C. or more.

Examples of useful multifunctional epoxy compounds include but are not limited to, phenol novolak epoxy resins, o-cresol novolak epoxy resins, triphenyl novolak epoxy resins, and bisphenol A novolak epoxy resins. The multifunctional Bisphenol A novolak epoxy resins are particularly useful, having a functionality of 5 or more. Commercial examples of useful multifunctional epoxy compounds are available as Epicoat 157 from Japan Epoxy Resin Co., Ltd. (Japan), Epiclon N-885 from Dainippon Ink and Chemicals Inc. (Japan), and Epon SU-8 from (Momentive Specialty Chemicals Inc.).

The amount of one or more multifunctional epoxy compounds used in the photocurable composition (and coated photocurable layers) is at least 10 weight % and up to and including 90 weight %, or typically at least 30 weight % and up to and including 90 weight % based on total photocurable composition solids.

In some embodiments, the photocurable composition comprises a multifunctional epoxy compound that is represented by the following Structure (II):

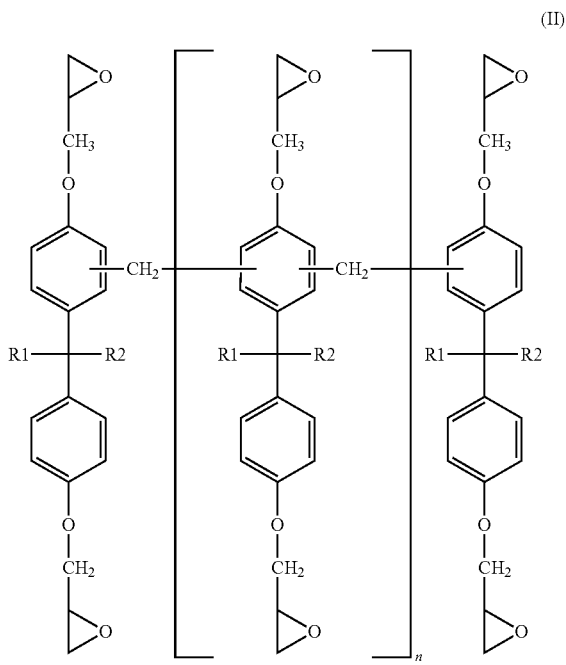

wherein R1 and R2 are independently hydrogen or methyl, and n is 0 or a positive integer, such as at least 1 and more likely at least 3.

The third essential component of the photocurable composition is an epoxysilane oligomer (or mixture thereof). The useful epoxysilane oligomers can be represented by the following Structure (I):

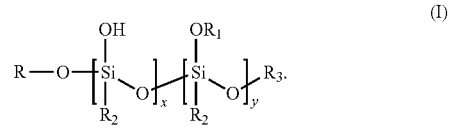

In Structure (I), R and $R_1$ are independently substituted or unsubstituted alkyl groups having 1 and up to and including 10 carbon atoms (both linear and branched groups) and including aryl-substituted alkyl (arylalkyl) groups. In particular R and $R_1$ are independently substituted or unsubstituted arylalkyl groups having at least 7 carbon atoms such as substituted or unsubstituted benzyl groups.

$R_2$ is a substituted or unsubstituted linear, branched, or cyclic alkyl group having up to and including 30 carbon atoms or an alkyl ether residue substituted with an epoxide $R_3$ is hydrogen or a substituted or unsubstituted alkyl (linear or branched groups, including cyclic alkyl groups) or an unsubstituted arylalkyl group, each having up to 10 carbon atoms.

In Structure (I), $x+y \geq 2$, or more particularly, the sum of x and y is at least 3.

For example, a useful epoxysilane oligomer can have the general structure represented by the following Structure (III):

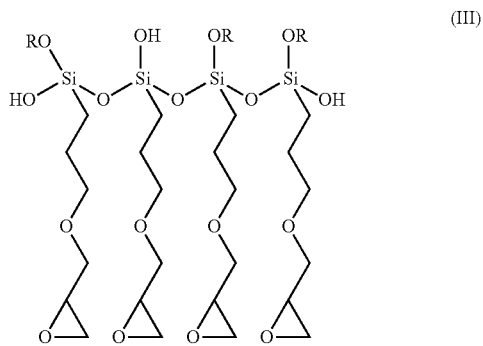

wherein R in Structure (III) is hydrogen or a substituted or unsubstituted alkyl group having 1 to 10 carbon atoms (linear or branched groups). For example, R can be a methyl or ethyl group. The epoxysilane oligomer in Structure (III), or any of the compounds described herein, can be characterized by the alcohol content and epoxy functionality.

The alcohol content of an epoxysilane oligomer can be measured by hydrolysis in water followed by gas chromatography to determine the amount of methanol liberated (methanol released). The epoxy functionality can be expressed in terms of meq/gram or epoxy equivalent weight.

A useful epoxysilane oligomer that is commercially available is Coatosil MP200 silane (available from Momentive Performance Materials Inc.), which epoxysilane oligomer has an alcohol content of about 22% and epoxy content of about 4.785 meq/gram. It is also possible that the epoxysilane oligomer have a softening point less than or equal to 20° C.

One or more epoxysilane oligomers are present in the photocurable composition (and coated photocurable layers) in an amount of at least 10 weight % and up to and including 90 weight %, or typically at least 10 weight % and up to and including 70 weight %, based on total photocurable composition total solids.

The photocurable compositions can also comprise one or more photosensitizers that can enhance sensitivity to the radiation used to initiate curing. A variety of photosensitizers are known in the art such as aromatic tertiary amines, aromatic tertiary diamines and certain aromatic polycyclic compounds such as substituted or unsubstituted anthracene compounds, as described for example in U.S. Pat. No. 4,069,054 (Smith) and U.S. Pat. No. 7,537,452 (Dede et al.), the disclosures of which are incorporated herein by reference. Particularly useful photosensitizers include unsubstituted anthracene and substituted anthracenes such as 9,10-diethoxyanthracene and 2-t-butyl-9,10-diethoxyanthracene.

Other useful photosensitizers include but are not limited to, N-alkyl carbazole such as N-ethyl carbazole, N-ethyl-3-formayl carbazole, 1,4,5,8,9-pentamethyl carbazole, and N-ethyl-3,6,dibenzoyl-9-ethylcarbazole. Naphthols can be used as photosensitizers and include but are not limited to, 1-naphthol, β-naphthol, α-naphthol methyl ether, and α-naphthol ethyl ether. Mixtures of photosensitizers can be used if desired.

One or more photosensitizers can be present in the photocurable composition (and coated photocurable layers) in an amount of at least 0.1 weight % and up to and including 10 weight %, or more likely at least 0.2 weight % and up to and including 5 weight %, based on the total solids in the photocurable composition (or dry coated photocurable layer weight).

The photocurable composition can further comprise one or more of an adhesion promoter, glycidyl ether reactive monomer, filler, lubricant, coating surfactant, matting agent, or conductive particle, all of which are known in the art.

The components of the photocurable composition can be dissolved or dispersed within a suitable solvent or mixture of solvents. Useful organic solvents include but not limited to, ketones (such as acetone, 2-butanone, 2-pentanone, 3-pentanone, methyl isobutyl ketone, methyl 1-butyl ketone, cyclopentanone, and cyclohexanone), ethers (such as dipropylene glycol dimethyl ether, and dipropylene glycol diethyl ether), tetrahydrofuran, 1,3-dioxolane, 1,4-dioxane, dimethoxyethane, diglyme, triglyme, esters (such as ethyl acetate, propyl acetate, butyl acetate, butyl cellulose acetate, carbitol acetate, propylene glycol monomethyl ether acetate, and gamma-butyrone lactone). Other useful solvents include those that can be used (mixed) with the organic solvents include alcohols and aromatic and aliphatic hydrocarbons A prepared photocurable composition can thus be formulated and then be applied over transparent substrate 10 by any coating method including but not limited to, spin coating, ultrasonic coating, extrusion hopper coating, blade coating, slide hopper coating, curtain coating, gravure coating, spray coating, air knife coating, and other methods known in the art. The applied photocurable composition can be dried on transparent substrate 10 to form photocurable layer 20.

Figure 2C:
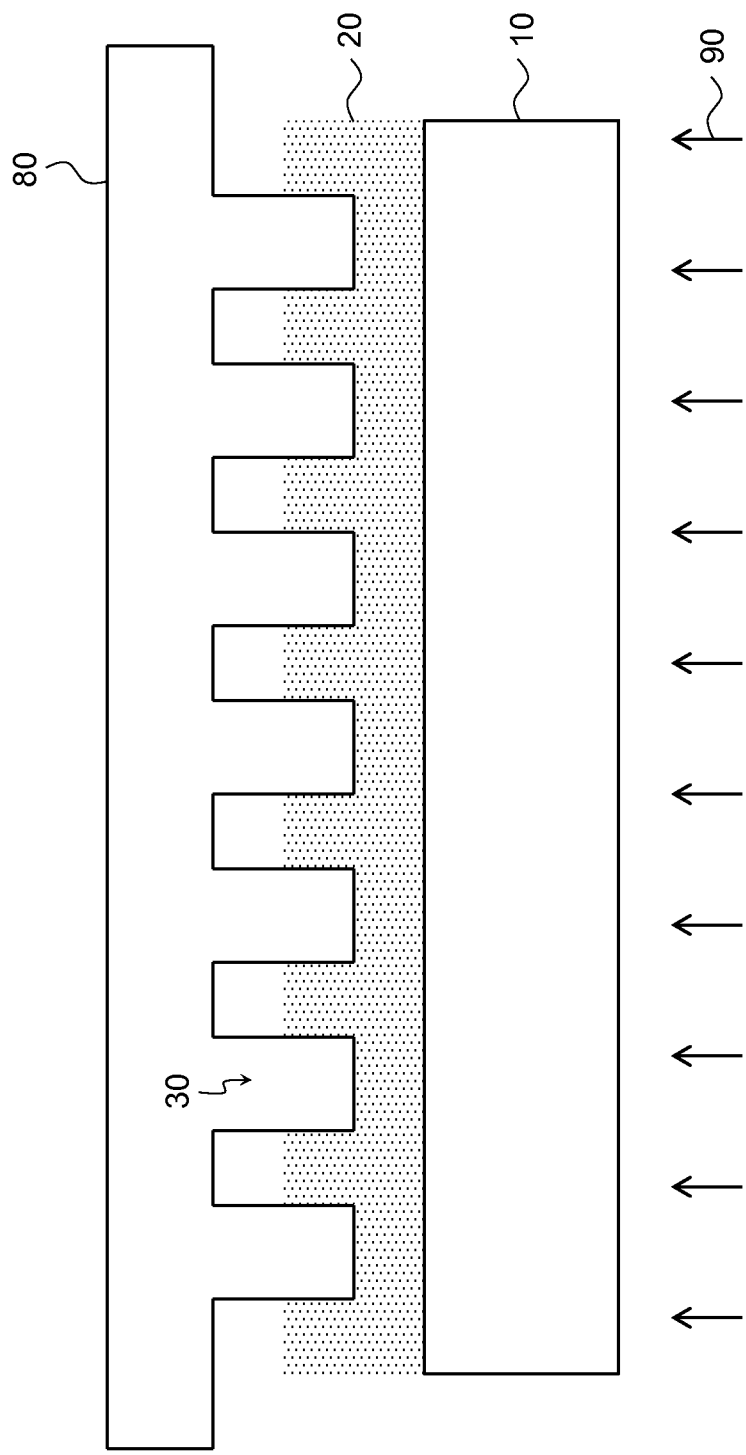
Figure 2D:
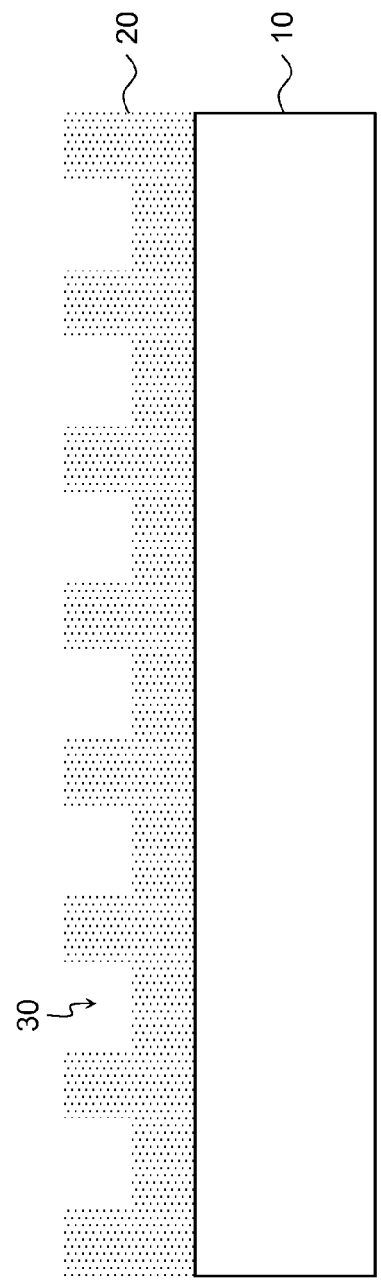

Referring to FIGS. 1 and 2C, mold 80 or stamp is pressed against the photocurable layer 20 to imprint one or more micro-channels 30 in photocurable layer 20 in step 110 and exposing photocurable layer 20 using an external radiation source 90 (such as a source of ultraviolet radiation) to cure photocurable layer 20 in step 115, and releasing mold 80 from the photocurable layer 20, leaving one or more micro-channels 30 in photocurable layer 20 on transparent substrate 10 (FIG. 2D). The exposure can be made through substrate 10 when transparent (as shown) or mold 80 (not shown) when it is transparent. Mold 80 can be formed from various known materials. To facilitate exposure through mold 80, it can be prepared from materials that are fairly transparent to an external radiation source to allow photocurable layer 20 to be cured during pressing (imprinting). Thus, mold 80 can be prepared from materials including but not limited to, quartz, silicone, organic polymers, siloxane polymers, borosilicate glass, fluorocarbon polymers, cyclic polyolefin, metals, and combinations thereof. To facilitate release of mold 80 from cured photocurable layer 20, mold 80 can be treated with a surface modifying agent that is well known in the art, such as a fluorocarbon silylating agent. The surface modifying agent may be applied, for example, from a plastic surface, a chemical vapor deposition process, a solution treatment, or a vapor treatment involving a solution.

For example, mold 80 can comprise a cured silicone selected from, for example, a condensation curable silicone, an addition-curable (hydrosilylation curable) silicone, a free radical curable silicone, or a cationic-curable silicone. In some embodiments, the curable silicone can be photocurable silicones, including UV and visible light curable silicones. In some embodiments, the curable silicone can further comprise reinforcing filler such as silica or quartz.

More particularly, mold 80 comprises an addition (or hydrosilylation) cured silicone. Such a cured silicone composition is typically formed by reacting a multiple ethylenically unsaturated group-containing organo-polysiloxane with an organo-polysiloxane containing a multiplicity of Si—H bonds per molecule. The reaction is typically facilitated by the presence of a platinum-containing catalyst.

With the use of photocurable layer 20, the pressing (imprinting) pressure of mold 80 can be adjusted depending on the imprinting time and temperature. For example, the pressing pressure can be less than 2 megaPascals. The pressing time can vary from a fraction of a second to minutes and the pressing temperature is generally less than 100° C.

Micro-channels 30 can have an average width of a few nanometers to many micrometers and an aspect ratio (width to depth) of greater than 0.1. For example, micro-channels 30 can have an average width of less than 50 µm and an aspect ratio greater than 0.1. Typically, micro-channels 30 have an average width of less than 10 µm and an aspect ratio of up to and including 10. In some embodiments, micro-channels 30 have an average width of at least 0.5 µm and up to and including 5 µm, and an aspect ratio of at least 0.1 and up to and including 10, and the micro-channels are formed on substrate 10 composed of a polyester, glass, or polycarbonate.

Figure 2E:
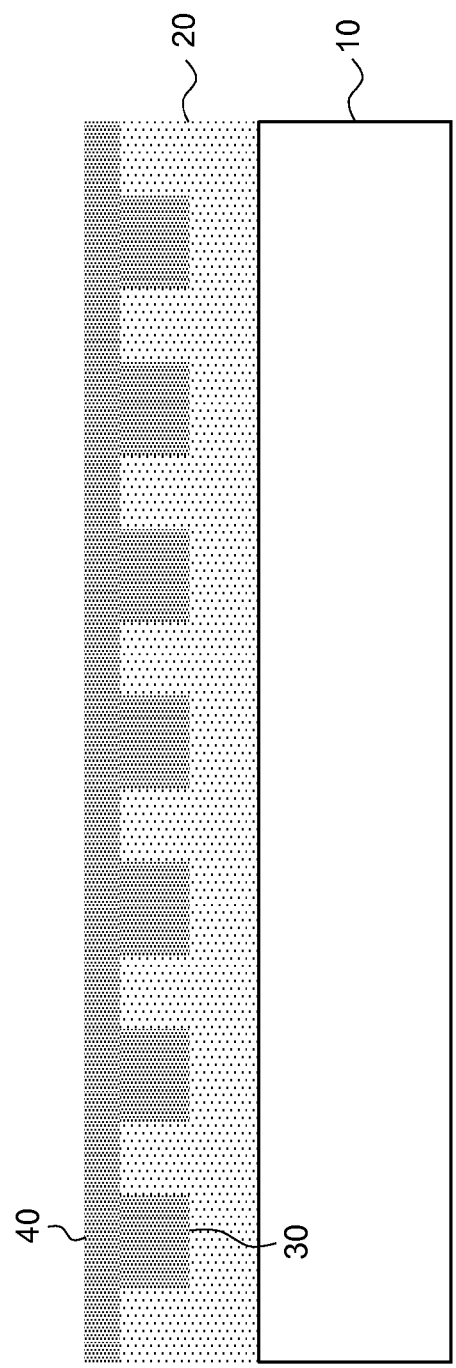
Figure 2F:
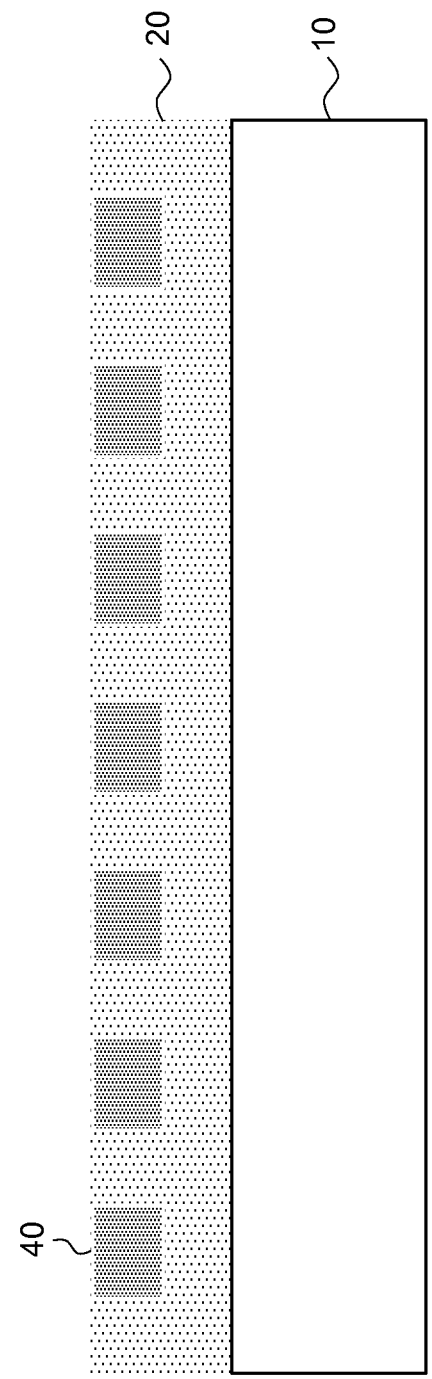

Referring to FIG. 2E, micro-channels 30 formed in accordance with the present invention can be filled with conductive composition (ink) 40 coated over photocured layer 20 and micro-channels 30 in step 120. Conductive composition (ink) 40 can comprise one or more conductive materials (such as conductive nano-particles) and a liquid carrier (or solvent). Excess conductive composition (ink) 40 is removed in step 125 from the transparent substrate surface leaving conductive composition (ink) 40 predominantly only in micro-channels (not shown in FIG. 2F). This excess removal can be done for example by any mechanical means.

Figure 2G:
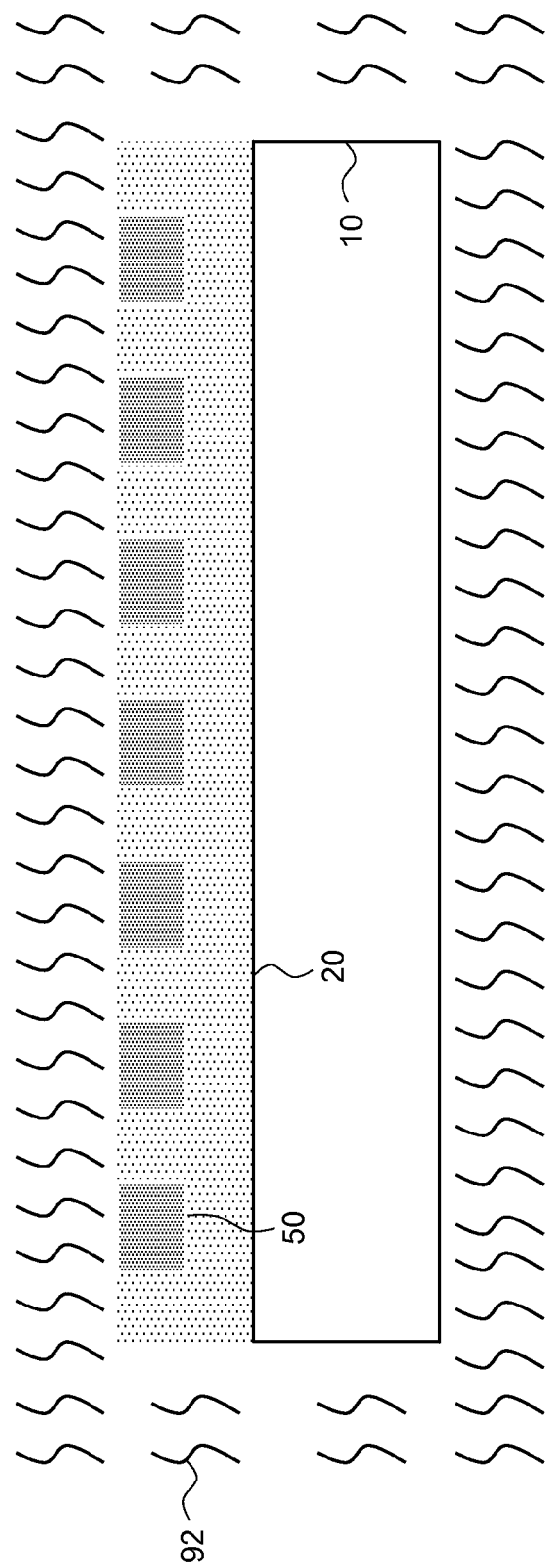

Referring to FIG. 2G, the liquid carrier is removed by drying in step 130, for example by the application of heat 92 to evaporate the liquid carrier leaving the conductive composition (ink) only in micro-channels (not shown) forming micro-wires 50 in photocurable layer 20 on transparent substrate 10. Useful drying temperatures are less than 60° C. The conductive composition (ink) can be further cured by light, or heat, or by a reagent including, for example, a vapor or a liquid composition, to further increase the conductivity of micro-wires 50. The conductive composition (ink) can include, for example, conductive particles such as conductive metal nano-particles (including conductive silver nano-particles), a conductive polymer, a soluble conductive precursor, and other materials known in the art. In many embodiments, the conductive material is a dispersion of conductive metal particles such as an aqueous dispersion of silver nano-particles. The metal nano-particles such as silver nano-particles can be present in the conductive composition in an amount of at least 10 weight % and up to and including 90 weight %, based on total conductive composition solids.

For example, aqueous silver nano-particle dispersions useful in the present invention can be prepared using a water-soluble polymer having both carboxylic acid and sulfonic acid groups. Such polymers can be prepared by various polymerization methods that are well known in the art such as free radical polymerization of a mixture of ethylenically unsaturated polymerization monomers that have sulfonic acid side groups and ethylenically unsaturated polymerizable monomers that have carboxylic acid side groups. Useful polymers can also be prepared by a post-modification of a pre-formed copolymer that has recurring units comprising carboxylic acid side groups. Sulfonic acid groups can be introduced in a formed polymer by sulfonation of recurring units that do not have carboxylic acid side groups. For example, poly(styrene-sulfonic acid-co-maleic acid) can be prepared by polymerization of a monomer mixture containing both styrene and maleic anhydride to form poly(styrene-co-maleic anhydride) and subsequent sulfonation and hydrolysis of the noted polymer.

Various ethylenically unsaturated monomers can be used to form the polymers for use to make useful silver nano-particle dispersions as conductive compositions (inks). Suitable ethylenically unsaturated polymerizable monomers comprising sulfonic acid side groups include but are not limited to, styrenesulfonic acid, 3-sulfopropyl acrylate, 3-sulfopropyl methacrylate, 2-sulfoethyl methacrylate, 3-sulfobutyl methacrylate, and 2-acrylamido-2-methylpropane sulfonic acid. Suitable ethylenically unsaturated polymerizable monomers containing carboxylic acid side groups include but are not limited to, acrylic monomers such as acrylic acid, methacrylic acid, ethacrylic acid, itaconic acid, maleic acid, fumaric acid, monoalkyl itaconate including monomethyl itaconate, monoethyl itaconate, and monobutyl itaconate, monoalkyl maleate including monomethyl maleate, monoethyl maleate, monobutyl maleate, citraconic acid, styrene carboxylic acid, 2-carboxyethyl acrylate, and 2-carboxyethyl acrylate oligomers.

Useful water-soluble polymers having both pendant carboxylic acid and sulfonic acid groups can have various microstructures, such as, for example, random copolymers, block copolymers, or graft copolymers. Such polymers can be linear, branched, and hyper-branched in form. The polymers can also comprise up to 10% of recurring units that comprise neither sulfonic acid groups nor carboxylic acid groups.

Preferably the ratio of the sulfonic acid side group to carboxylic acid side group is at least 0.05:1 and up to and including 5:1 or at least 0.1:1 and up to and including 4:1 or more likely at least 0.5:1 and up to and including 2:1. The molecular weight of the useful polymers is typically at least 500 and up to and less than 500,000, or up to but less than 100,000, or at least 500 and up to and including 50,000.

Useful silver nano-particle dispersions can be provided, for example, by forming an aqueous mixture of a water-soluble polymer and a reducing agent, adding a source of silver ion, and growing the silver nano-particles in the dispersion. Suitable reducing agents are typically agents that are capable of reducing metals (such as silver ion) in aqueous dispersions and include but are not limited to, hydrazine, hydrazine hydrate, hydrogen, sodium borohydride, lithium borohydride, ascorbic acid, formic acid, aldehydes, and amines including a primary amine, a secondary amine, and a tertiary amine, and any combination thereof. Suitable silver ion sources can be any water-soluble silver compound or salt such as silver nitrate, silver acetate, and $AgClO_4$. The reaction temperatures to form silver nano-particles be at least room temperature (about 20° C.) and up to and including 95° C., such as above 60° C.

Further details for making the useful silver nano-particles are provided in copending and commonly assigned U.S. Ser. No. 13/757,891 (noted above).

The mean size of the useful silver nano-particles in the dispersions can be at least 5 nm and up to and including 500 nm, and can be varied by the amount of water-soluble polymer, the reaction temperature, and the speed and method of agitation during reaction. In certain embodiments, the conductive composition can have a light absorption such that the wavelength absorbance maximum is at least 400 nm and up to and including 500 nm.

The silver nano-particle dispersions useful in the present invention can be formulated into various conductive compositions (inks) and coating formulations for various applications.

Figure 2H:
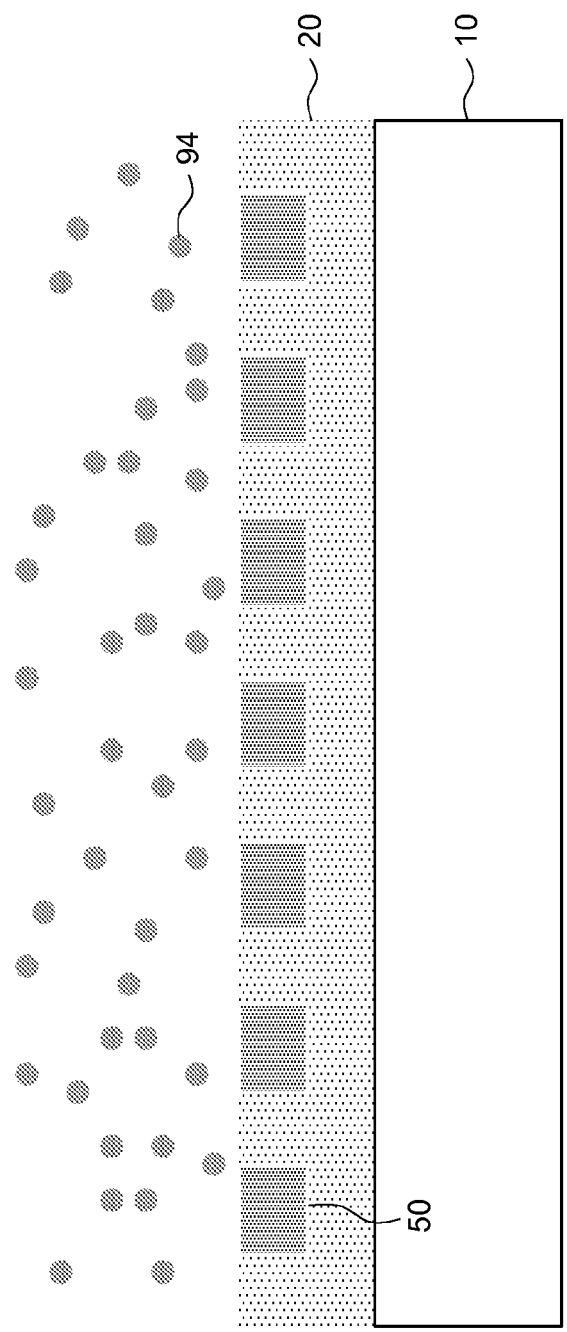

Referring to FIG. 2H, dried conductive composition (ink) 40 (not shown) forming micro-wires 50 is exposed to hydrogen chloride (hydrochloric acid) in liquid or vapor form. In particular, micro-wires 50 are exposed to either wet or dry hydrogen chloride vapor 94 in step 135. The dried silver nano-particles are rendered more highly conductive by this exposure. In particular embodiments, the treatment is carried out using a hydrogen chloride vapor source at a temperature of less than 60° C., or particularly at a temperature of less than 50° C. or even as low as room temperature (about 20° C.). There is no limit on the time required for this treatment depending upon the source and composition of the hydrogen chloride vapor. For desired productivity, it is desirable that the treatment be for at least 3 seconds and up to and including 10 minutes, or more likely at least 10 seconds and up to and including 5 minutes.

Figure 2I:
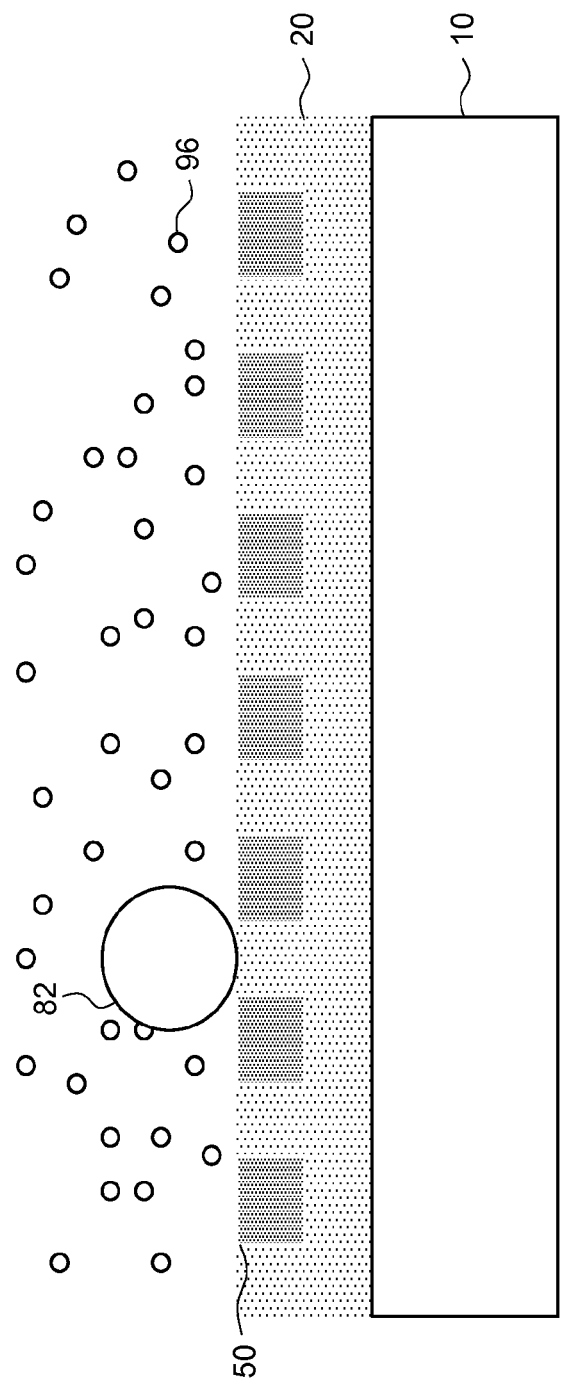
Figure 2J:
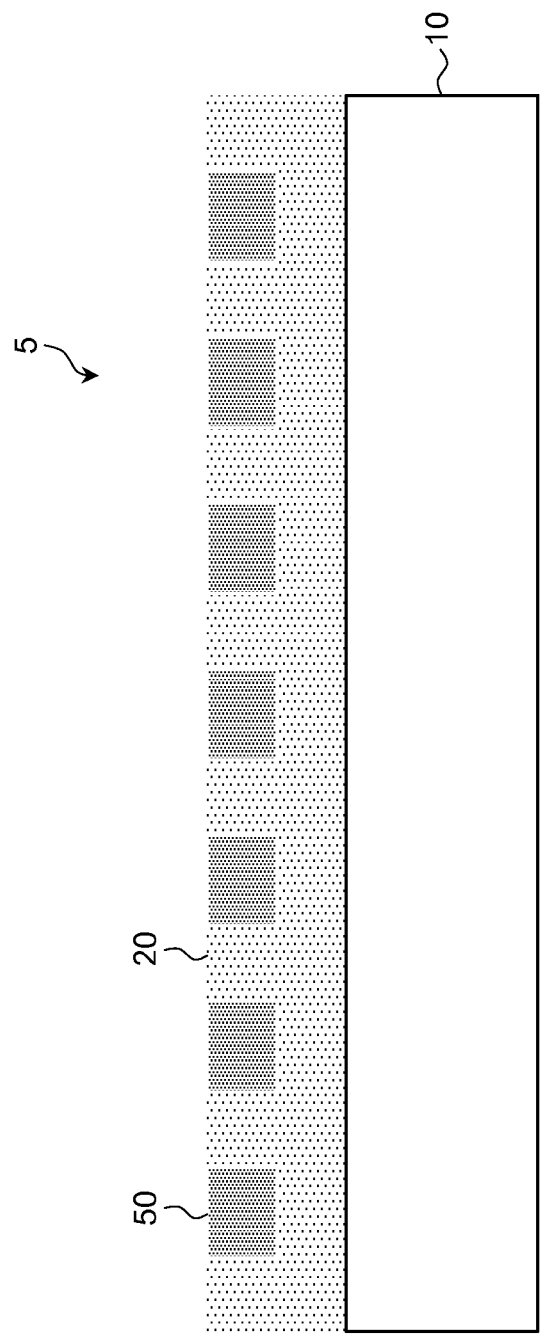

As illustrated in FIG. 2I, the surface of radiation cured layer 20 with conductive micro-wires 50 is then polished (step 140) in the presence of water 96 (such as water vapor) to form a desired micro-wire pattern of micro-wires 50 on transparent substrate 10. The means for this polishing can be polisher 82 that is a mechanical polishing apparatus comprising a soft polishing pad that can also be wet with water. Such polishing materials include but are not limited to, a fabric cloth, synthetic hydrogels comprising cross-linked water-soluble polymers, and open cell foams comprised of foamed materials such as foamed polyurethane. A soft polishing pad can be mounted on a rotating disc, a roller, or a wiper blade. Excellent polishing results can be obtained by a combination of translation, rotation, and vibration of the polishing pad.

In particularly useful embodiments, the polishing pad surface does not contain any significant amount of large abrasive particles that can cause surface scratching or mechanical damage to the conductive micro-wires. Polishing step 140 in the presence of water effectively removes undesired residual cured and treated conductive composition (ink) to enhance the transparency of imprinted micro-wire structure 5, resulting in a highly transparent article comprising transparent substrate 10 and photocured layer 20 having imprinted micro-wires 50 forming a micro-wire structure 5 (see FIG. 2J).

Thus, the present invention can be used to provide a conductive electrode (article) comprising very fine patterns of conductive micro-wires entrenched in micro-channels on transparent substrate wherein the micro-channels comprise a photocured layer and the conductive micro-wires comprise conductive metal nano-particles (such as silver nano-particles).

After polishing, the conductivity of the micro-wire structure can be further increased by heating it at a temperature greater than or equal to 60° C., and optionally or additionally, treating the micro-wire pattern to an environment having a humidity greater than 60%, for examples for at least four hours.

Figure 4:
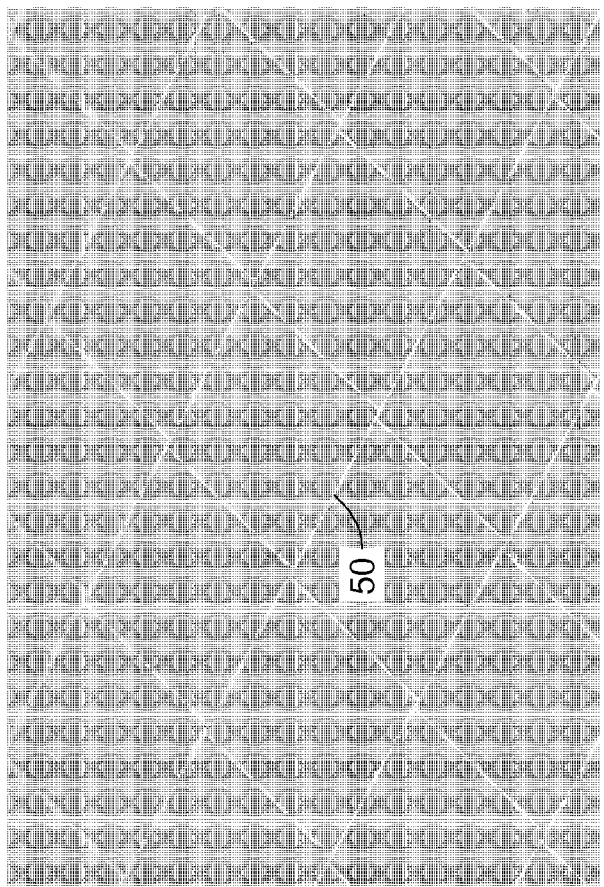
FIG. 4 is a micrograph of conductive micro-wires formed in accordance with the method of the present invention.

FIG. 3 illustrates a useful embodiment wherein silver nano-particle dispersions are patterned to form micro-wire grids 50, mesh or other micro-wire patterns that have low apparent visibility, high transparency (for example, greater than 80% in the visible light transmittance) and low electrical resistivity (for example, less than 15 ohms/square, 10 ohms/square, or 5 ohms/square). In certain embodiments, such micro-wires 50 have an average width of at least 0.5 μm and up to and including 8 μm and greater than 0.2 μm in average dry thickness. FIG. 4 is a micrograph of a grid of micro-wires 50 prepared according to the method of the present invention.

The present invention provides at least the following embodiments and combinations thereof, but other combinations of features are considered to be within the present invention as a skilled artisan would appreciate from the teaching of this disclosure:

1. A method of making a micro-wire pattern in an article, the method comprising:
   providing a photocurable article comprising a photocurable composition on a transparent substrate,
   forming a pattern of micro-channels within the photocurable composition, exposing the photocurable composition to curing radiation to form cured photocurable composition and photocured micro-channels within the cured photocurable composition on the transparent substrate,
   applying a conductive composition comprising metal nano-particles to the photocured micro-channels,
   removing any excess conductive composition outside the photocured micro-channels while leaving conductive composition within the photocured micro-channels,
   drying the conductive composition in the photocured micro-channels at a temperature of less than 60° C. to provide a dried conductive composition as conductive micro-wires in the photocured micro-channels,
   exposing the dried conductive composition in the photocured micro-channels to hydrogen chloride at a temperature of less than 60° C. to enhance the conductivity of the conductive micro-wires in the photocured micro-channels, and
   polishing the outer surface of the cured photocurable composition in the presence of water, to form a micro-wire pattern on the transparent substrate.

2. The method of embodiment 1, further comprising heating the micro-wire pattern at a temperature greater than or equal to 60° C.

3. The method of embodiment 1 or 2, further comprising treating the micro-wire pattern to an environment having a humidity greater than 60%.

4. The method of embodiment 3, comprising treating the micro-wire pattern to the humid environment for at least four hours.

5. The method of any of embodiments 1 to 4, comprising exposing the dried conductive composition to the hydrogen chloride vapor for at least three seconds and up to and including 10 minutes.

6. The method of any of embodiments 1 to 5, comprising removing any excess conductive composition using mechanically means.

7. The method of any of embodiments 1 to 6, wherein the curing radiation is ultraviolet radiation.

8. The method of any of embodiments 1 to 7, wherein the photocurable composition comprises a crosslinkable material.

9. The method of any of embodiments 1 to 8, wherein the conductive composition comprises silver nano-particles.

10. The method of any of embodiments 1 to 9, wherein the transparent substrate comprises a flexible polymeric material.

11. The method of any of embodiments 1 to 10, wherein the photocured micro-channels have an average aspect ratio (width to depth) greater than 0.1 and up to and including 10, and an average width of at least 0.5 μm and up to and including 5 μm.

12. The method of any of embodiments 1 to 11, wherein the conductive composition comprises silver nano-particles in an amount greater than or equal to 10 weight % of the total conductive composition solids.

13. An article comprising a transparent substrate and a micro-wire pattern prepared according to the method of any of embodiments 1 to 12.

14. The article of embodiment 13 that exhibits a haze of less than 10% and a light transmission of at least 80%.

The following Examples are provided to illustrate the practice of this invention and are not meant to be limiting in any manner.

INVENTIVE EXAMPLE 1

Forming a Conductive Film Comprising Micro-Wires

A poly(ethylene terephthalate) film having a thickness of about 125 μm was surface treated with a poly(vinylidene chloride) containing latex to form an adhesion promotion subbing layer. A coating solution consisting of 34.0 g of Epon resin SU-8, 6.0 g of Coatosil MP-200, 4.8 g of triarylsulfonium hexafluorophosphate salts (mixed), 50% in propylene carbonate, and 55.2 g of methyl ethyl ketone (MEK) was applied as a photocurable composition over the subbing layer and dried to form a photocurable layer having a nominal dry thickness of about 12 μm. The resulting dry film photocurable surface was then laminated with a protective sheet of approximately 25.4 μm thick having one of its surfaces treated with silicone release coating. The protective sheet can be readily separated from the photocurable layer.

The photocurable layer on the substrate was pressed against a transparent PDMS mold made of Dow Corning Sylgard 184 siloxane elastomer at 90° C. for about 3 minutes at 5 psi (0.034 megaPascals) and 2 minutes at 25 psi (0.17 megaPascals) followed by exposure to ultraviolet light. The PDMS mold contained 16 measurement cells wherein each measurement cell was about 102.3 mm long and 3.78 mm wide and was made with the connected diamond structure shown in FIG. 3. Therefore each measurement cell contained about 170.5 diamonds long and 7 diamonds wide. The resulting imprinted lines were 4 μm wide and 4 μm high. The mold surface contained a diamond-line pattern of 600 by 540 μm. FIG. 3 shows a single diamond pattern with side 1 and side 3 being rotated by +1-9.42 microns and 2.66 degree. The lengths of the sides were 402 μm for sides 1 and 3, and 403.6 μm for sides 2 and 4.

After exposure, the mold was separated from the cured photocurable layer to leave imprints having diamond line patterns except that the diamond line patterns were now made of micro-channels having both width and depth of about 4 μm.

The resulting imprint pattern of micro-channels was filled with an aqueous conductive composition (ink) comprising about 75 weight % of silver nano-particles having a mean particle size of about 73 nm, 0.75 weight % of poly(vinylidene chloride-co-ethyl acrylate-co-acrylic acid) (85/14/1) latex, and 0.34 weight % of a carbon black dispersion having a mean particle size of about 120 nm. The silver nano-particles were prepared as described in copending and commonly assigned U.S. Ser. No. 13/757,891 (noted above). Excess conductive composition on the photocured layer surface (generally outside the cured micro-channels) was removed with a wiper blade. This wiping was conducted in such a fashion that most conductive composition on the photocured layer surface was removed without disturbing the conductive composition that was disposed within in the cured micro-channels. The conductive composition in the cured micro-channels was dried at room temperature, treated with saturated hydrogen chloride vapor for 2 minutes, polished using a wet cloth, and cured further at 90° C. for 2 minutes.

The resulting article (transparent electrode) had excellent micro-wire uniformity without any significant distortion of the article structure (see FIG. 4). The article also exhibited a surface resistivity of less than 6 ohms/sq, a light transmission of about 87% without lamination to glass with an anti-reflection coating, and a haze of about 0.95%.

The resulting transparent electrode, when tested for adhesion, scratch resistance, and cyclic bending properties, demonstrated excellent performance by all of these measures.

COMPARATIVE EXAMPLE 1

An article having conductive micro-wires was prepared in a similar manner to Invention Example 1 except that the filled imprinted micro-channels were cured by a Novacentric Pulse Forge 3300 (Novacentric). The Pulse Forge 3000 system was equipped with a flash lamp that issues, under an electrical current pulse, a high intensity broad spectrum pulse of light, which is absorbed by the metal nano-particles, heating them to such a degree that they fuse to form a conductive wire. The curing was carried out at various conditions by varying the power from 220 to 280 volts, pulse width from 800 to 2000, and number of pulses of from 1 to 10. It was found that a minimum voltage of 240 volts was required to cure the conductive composition comprising silver nano-particles to form conductive micro-wires, and a voltage of 260 is required to form highly conductive micro-wires. However, under such conditions, the heat distortion of the substrate became visible and was highly dependent on the density of the micro-wires or the silver area coverage. Higher silver area coverage caused more substrate distortion or exhibited burning marks. It was also found that the residual cured silver could not be removed by polishing, which significantly reduced the transparency of the resulting articles. Thus, no hydrogen chloride treatment was carried out in this Comparative Example.

The invention has been described in detail with particular reference to certain preferred embodiments thereof, but it will be understood that variations and modifications can be effected within the spirit and scope of the invention.

Parts List

5 Imprinted micro-wire structure
10 Substrate (transparent substrate)
20 Photocurable layer
30 Micro-channel(s)
40 Conductive composition (ink)
50 Micro-wire(s)
80 Imprinting mold or stamp
82 Polisher
90 Radiation
92 Heat
94 Hydrogen chloride vapor
96 Water vapor
100 Provide substrate feature
105 Coat layer on (transparent) substrate feature
110 Imprint micro-channels feature
115 Cure micro-channels feature 120 Coat conductive ink feature
125 Remove conductive ink from surface feature
130 Dry conductive ink feature
135 Hydrogen chloride treating dried conductive ink feature
140 Polishing surface of radiation cured layer with conductive micro-wires in the presence of water feature

The invention claimed is:

1. A method of making a micro-wire pattern in an article, the method comprising:
   providing a photocurable article comprising a photocurable composition on a transparent substrate,
   forming a pattern of micro-channels within the photocurable composition,
   exposing the photocurable composition to curing radiation to form cured photocurable composition and photocured micro-channels within the cured photocurable composition on the transparent substrate,
   applying a conductive composition comprising metal nano-particles to the photocured micro-channels,
   removing any excess conductive composition outside the photocured micro-channels while leaving conductive composition within the photocured micro-channels,
   drying the conductive composition in the photocured micro-channels at a temperature of less than 60° C. to provide a dried conductive composition as conductive micro-wires in the photocured micro-channels,
   exposing the dried conductive composition in the photocured micro-channels to hydrogen chloride at a temperature of less than 60° C. to enhance the conductivity of the conductive micro-wires in the photocured micro-channels, and
   polishing the outer surface of the cured photocurable composition in the presence of water, to form a micro-wire pattern on the transparent substrate.

2. The method of claim 1, further comprising heating the micro-wire pattern at a temperature greater than or equal to 60° C.

3. The method of claim 1, further comprising treating the micro-wire pattern to an environment having a humidity greater than 60%.

4. The method of claim 3, comprising treating the micro-wire pattern to the humid environment for at least four hours.

5. The method of claim 1, comprising exposing the dried conductive composition to the hydrogen chloride vapor for at least three seconds and up to and including 10 minutes.

6. The method of claim 1, comprising removing any excess conductive composition using mechanically means.

7. The method of claim 1, wherein the curing radiation is ultraviolet radiation.

8. The method of claim 1, wherein the photocurable composition comprises a crosslinkable material.

9. The method of claim 1, wherein the conductive composition comprises silver nano-particles.

10. The method of claim 1, wherein the transparent substrate comprises a flexible polymeric material.

11. The method of claim 1, wherein the photocured micro-channels have an average aspect ratio (width to depth) greater than 0.1 and up to and including 10, and an average width of at least 0.5 µm and up to and including 5 µm.

12. The method of claim 1, wherein the conductive composition comprises silver nano-particles in an amount greater than or equal to 10 weight % of the total conductive composition solids.

13. An article comprising a transparent substrate and a micro-wire pattern prepared according to the method of claim 1.

14. The article of claim 13 that exhibits a haze of less than 10% and a light transmission of at least 80%.

* * * * *